(12) United States Patent
Nakamura et al.

(10) Patent No.: US 9,287,225 B2
(45) Date of Patent: Mar. 15, 2016

(54) SEMICONDUCTOR DEVICE AND MANUFACTURING METHOD THEREOF

(71) Applicant: KABUSHIKI KAISHA TOSHIBA, Tokyo (JP)

(72) Inventors: Kenro Nakamura, Oita (JP); Hirokazu Ezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/191,308

(22) Filed: Feb. 26, 2014

(65) Prior Publication Data

US 2015/0028493 A1 Jan. 29, 2015

(30) Foreign Application Priority Data

Jul. 23, 2013 (JP) ................. 2013-152523

(51) Int. Cl.
*H01L 21/302* (2006.01)
*H01L 23/00* (2006.01)
(Continued)

(52) U.S. Cl.
CPC .............. *H01L 24/08* (2013.01); *H01L 23/481* (2013.01); *H01L 23/53238* (2013.01); *H01L 24/03* (2013.01); *H01L 24/05* (2013.01); *H01L 24/11* (2013.01); *H01L 24/13* (2013.01); *H01L 24/80* (2013.01); *H01L 24/81* (2013.01); *H01L 25/0657* (2013.01); *H01L 2224/0345* (2013.01); *H01L 2224/0347* (2013.01); *H01L 2224/03462* (2013.01); *H01L 2224/03616* (2013.01); *H01L 2224/05006* (2013.01); *H01L 2224/05026* (2013.01); *H01L 2224/05547* (2013.01); *H01L 2224/05557* (2013.01); *H01L 2224/05562* (2013.01); *H01L 2224/05571* (2013.01); *H01L 2224/05572* (2013.01); *H01L 2224/05639* (2013.01); *H01L 2224/05647* (2013.01); *H01L 2224/05686* (2013.01); *H01L 2224/08147* (2013.01); *H01L 2224/08148* (2013.01); *H01L 2224/10126* (2013.01); *H01L 2224/1147* (2013.01); *H01L 2224/11462* (2013.01); *H01L 2224/11616* (2013.01);
(Continued)

(58) Field of Classification Search
None
See application file for complete search history.

(56) References Cited

U.S. PATENT DOCUMENTS 5,427,638 A * 6/1995 Goetz ................. C03C 23/0055
148/DIG. 22
7,217,631 B2 * 5/2007 Suga ................. H01L 23/49827
257/E23.063
(Continued)

FOREIGN PATENT DOCUMENTS

JP 2001-068618 A 3/2001
JP 2010-103533 A 5/2010
(Continued)

*Primary Examiner* — Benjamin Sandvik
*Assistant Examiner* — Herve Assouman
(74) *Attorney, Agent, or Firm* — Patterson & Sheridan, LLP (57) ABSTRACT

A method of manufacturing a semiconductor device includes forming an opening in a first substrate and filling the opening with a metal to form a first connection electrode. The first substrate is then polished by chemical mechanical polishing under conditions such that a polishing rate of the metal is less that of the region surrounding the metal. The chemical mechanical polishing thereby causes the first connection electrode to protrude from the surface of the first substrate. The first substrate is stacked with a second substrate having a second connection electrode. The first and second connection electrodes are bonded by applying pressure and heating to a temperature that is below the melting point of the metal of the first connection electrode.

21 Claims, 9 Drawing Sheets

(51) Int. Cl.
*H01L 23/48* (2006.01)
*H01L 23/532* (2006.01)
*H01L 25/065* (2006.01)

(52) U.S. Cl.
CPC ............... *H01L 2224/13009* (2013.01); *H01L 2224/13017* (2013.01); *H01L 2224/13022* (2013.01); *H01L 2224/8083* (2013.01); *H01L 2224/80203* (2013.01); *H01L 2224/8183* (2013.01); *H01L 2224/81193* (2013.01); *H01L 2224/81203* (2013.01); *H01L 2924/351* (2013.01)

(56) References Cited

U.S. PATENT DOCUMENTS

| | | | |
|---|---|---|---|
| 8,053,900 B2 | 11/2011 | Yu et al. | |
| 8,241,995 B2* | 8/2012 | Chen | B23K 20/023 216/34 |
| 2004/0020134 A1* | 2/2004 | Kim | C09G 1/02 51/307 |
| 2006/0131501 A1* | 6/2006 | Ikushima | G01J 5/02 250/338.1 |
| 2006/0292823 A1* | 12/2006 | Ramanathan | H01L 21/76801 438/455 |
| 2008/0006938 A1* | 1/2008 | Patti | H01L 21/76898 257/734 |
| 2009/0321909 A1 | 12/2009 | Gu et al. | |
| 2012/0187516 A1* | 7/2012 | Sato | H01L 27/1461 257/443 |
| 2012/0241981 A1 | 9/2012 | Hirano | |

FOREIGN PATENT DOCUMENTS

| | | |
|---|---|---|
| JP | 2011-187823 A | 9/2011 |
| JP | 2011-526081 A | 9/2011 |
| JP | 2011-243689 A | 12/2011 |
| JP | 2012-204443 A | 10/2012 |

* cited by examiner

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2013-152523, filed Jul. 23, 2013, the entire contents of which are incorporated herein by reference.

FIELD

Embodiments described herein relate generally to a semiconductor device and a manufacturing method thereof.

BACKGROUND

A three-dimensional stacked body semiconductor device is being developed in order to provide high density and high-performance. As one of methods of forming the three-dimensional stacked body, there is a method in which chips are stacked so as to overlap each other and electrodes provided in the chips are directly connected to each other. A through-silicon-via (TSV) is used as an electrode in this method. In the related art, convex portions made of metal with a low melting point, that is, bumps are formed at end parts of the TSV, and the bumps are melted so as to bond to each other. This method is called a micro-bump method.

In this micro-bump method, there are cases where TSVs adjacent to each other may become short-circuited by protrusions from the bumps formed when the bumps are melted. This issue limits the minimum pitch between the TSVs on the chip surface which hampers miniaturization of stacked semiconductor devices.

DETAILED DESCRIPTION

Embodiments provide a semiconductor device and a manufacturing method thereof that is capable of reducing a pitch between connection electrodes in a device substrate surface and increasing bonding strength between the connection electrodes.

According to one embodiment, a method of manufacturing a semiconductor device includes forming an opening in a first substrate and filling the opening with a metal to form a first connection electrode. In some embodiments, the opening may be a through-substrate-via (when the substrate is silicon, this is referred to as through-silicon-via). The first substrate is then polished by chemical mechanical polishing (CMP) under conditions such that a polishing rate of the metal is less that of the region surrounding the metal. The chemical mechanical polishing thereby causes the first connection electrode to protrude from the surface of the first substrate. The first substrate is stacked with a second substrate having a second connection electrode. The first and second connection electrodes, in a facing arrangement with each other, are then bonded by applying pressure and heating to a temperature that is below the melting point of the metal of the first connection electrode. This bonding process may be a diffusion bonding process.

Hereinafter, example embodiments will be described with reference to the drawings. However, the disclosure is not limited to these specific example embodiments. In addition, a common reference numeral is used when a portion or element is depicted in multiple drawings, and repeated description may be omitted. Further, the drawings are schematic diagrams provided for the purpose of description of embodiments and for better understanding thereof. Shapes, dimensions, scales, relative sizes, and the like of elements in the drawings are not intended, unless such is specifically stated, to be indications of specific shapes, dimensions, scales, or relative sizes. Such depicted elements may be different from those in a practical device, but such elements may be appropriately changed in design of a device by referring to the following description and well-known techniques.

In the following embodiments, a vertical direction with respect to a substrate indicates a relative direction in which a surface on which semiconductor elements are provided is set to be a top, and this vertical may be different from a up/down direction based on gravitational acceleration.

First Embodiment

Formation of Stacked Body

Figure 1A:
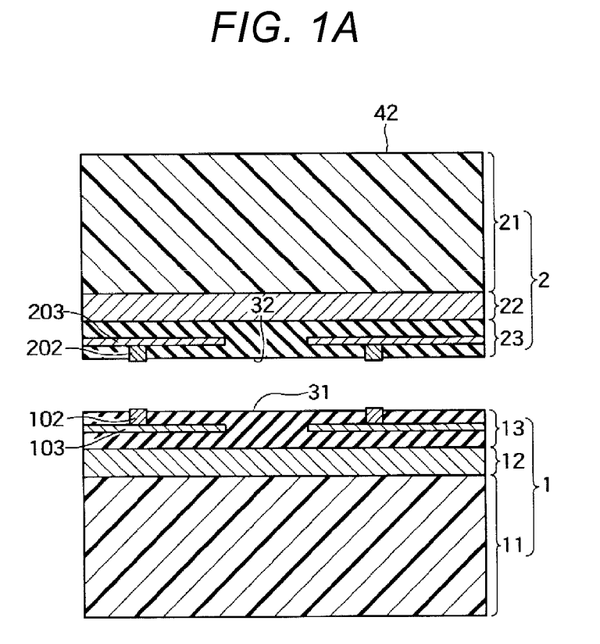
FIGS. 1A and 1B are cross-sectional views illustrating a manufacturing method of a semiconductor device according to a first embodiment.
Figure 1B:
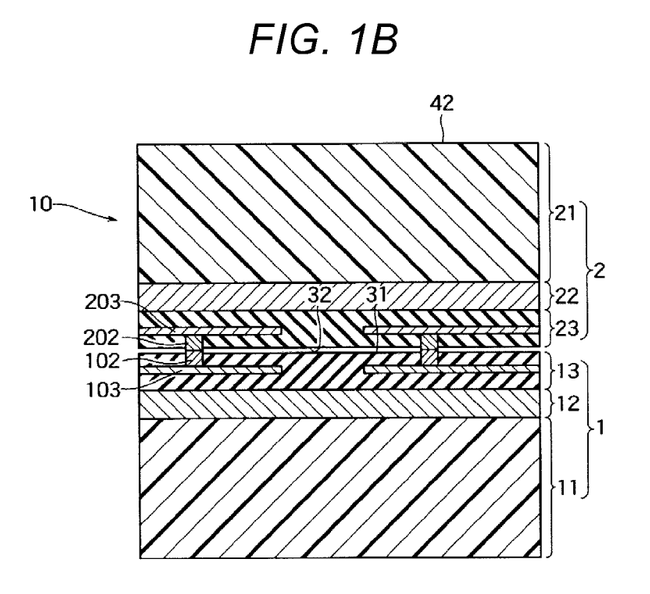

FIGS. 1A and 1B are cross-sectional views illustrating steps in a method of forming a stacked body 10. With reference to FIGS. 1A and 1B, a method of forming the stacked body 10 formed of device substrates 1 and 2 will be described. In addition, a method of forming connection electrodes 102 and 202 provided in the device substrates 1 and 2 will be described later.

First, as shown in FIG. 1A, the device substrates 1 and 2 are prepared. The device substrates 1 and 2 have a wafer or chip (die) form, and respectively have device layers 12 and 22 in which circuit elements (not specifically depicted) such as transistors are formed, wire layers 13 and 23 in which wirings 103 and 203 are formed, and silicon layers 11 and 21. Connection electrodes 102 and 202 are formed on surfaces 31 and 32 of the device substrates 1 and 2. The connection electrodes 102 and 202 have a shape which protrudes from the front surfaces 31 and 32 of the device substrates 1 and 2.

Next in the fabrication process, the front surface 31 of the device substrate 1 and the front surface 32 of the device substrate 2 are arranged to face each other immediately after the connection electrodes 102 and 202 are formed, so that cleanliness of the bonding surfaces of the connection electrodes 102 and 202 can be maintained. That is, by arranging the bonding surfaces to face each other soon after formation of the connection electrodes 102 and 202 there is less time for the bonding surfaces to be contaminated by atmospheric particles.

Next, a rear surface 42 of the device substrate 2 is pressed so as to cause the bonding surfaces of the connection electrodes 102 and 202 to come into contact with each other. At this time, preferably, an applied pressure is adjusted such that the pressure applied to the rear surface 42 of the device substrate 2 is 10 kgf/cm$^2$.

Furthermore, the device substrates 1 and 2 are heated along with the pressure application. If the connection electrodes 102 and 202 are formed of a Cu film, the heating temperature is a temperature which is equal to or lower than a melting point of the Cu film, preferably 100° C. or more and 500° C. or less, and, more preferably, about 400° C.

As a heating method, for example, there is a method of making a temperature of a stand holding the device substrates 1 and 2 high. By pressing and heating the device substrates 1 and 2 in this way, the connection electrodes 102 and 202 undergo diffusion bonding, so as to form the stacked body 10 as shown in FIG. 1B.

Here, the diffusion bonding is a technique in which the connection electrodes 102 and 202 are made to be in close contact with each other. The device substrates 102 and 202 are pressed while at a temperature lower than a melting point of a material of the connection electrodes 102 and 202. This sub-melt pressing permits diffusion of atoms between the bonding surfaces of the connection electrodes 102 and 202, and these connection electrodes 102 and 202 are bonded to each other using diffusion. Since the heating is performed at the temperature which is equal to or lower than the melting point of the connection electrode material, the connection electrode material does not melt or form protrusions, and thus are adjacent connection electrodes can be prevented from being short-circuited.

In addition, since the device substrates 1 and 2 are heated and pressed, the diffusion bonding is not only prompted, but bending or undulation of the device substrates 1 and 2 can also be corrected. Accordingly, the front surfaces of the device substrates 1 and 2 can be flattened so as to secure contact between the connection electrodes 102 and 202.

In addition, since bending or undulation of the device substrates 1 and 2 can be corrected by pressing the device substrates 1 and 2, the extent (distance) of protrusion for connection electrodes 102 and 202 from the front surfaces of the device substrates 1 and 2 may be reduced. In other words, even when the protrusion distance is small, bending (bowing) or undulation of the device substrates 1 and 2 can be corrected by pressing the device substrates 1 and 2, and thus contact between the connection electrodes 102 and 202 can be secured without the need for electrodes 102 and 202 to protrude to a distance that would otherwise be required to compensate or account for substrate bowing or non-flatness.

Also, if the protrusion extent of the connection electrodes 102 and 202 is small, a disparity range (distribution) of the protrusion extent is also likely to be relatively small, and thus a plurality of connection electrodes 102 and 202 having a relatively uniform protrusion extent can be formed in the device substrate surface. For this reason, if the device substrates 1 and 2 having a plurality of connection electrodes 102 and 202 are stacked, all the connection electrodes 102 and 202 facing each other can be bonded uniformly.

Formation of Connection Electrodes

FIGS. 2A to 2D are enlarged cross-sectional views of a region in which the connection electrode 102 of the device substrate 1 is scheduled to be formed. A method of forming the connection electrode 102 will be described with reference to FIGS. 2A to 2D. In addition, the connection electrode 202 of the device substrate 2 is formed by a similar method as the connection electrode 102, and thus only a method of forming the connection electrode 102 will be described here.

Figure 2A:
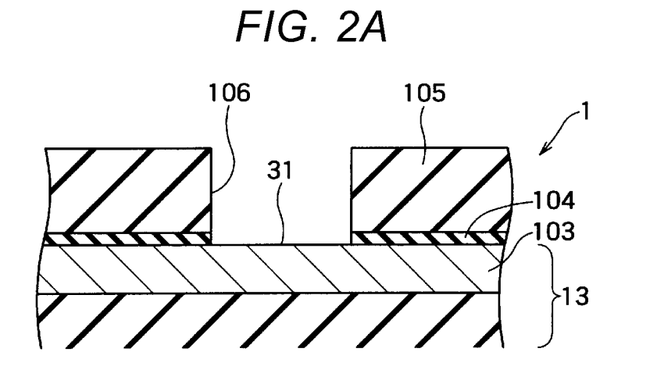
FIGS. 2A to 2D are cross-sectional views illustrating the manufacturing method of the semiconductor device according to the first embodiment.

The wiring 103 is formed on the front surface 31 side (the wire layer 13 side) of the device substrate 1 using a damascene method. A silicon nitride (SiN) film 104 and a tetraethyl orthosilicate (TEOS) film 105 are formed on the wiring 103. In addition, as shown in FIG. 2A, an opening 106 of, for example, 5 μm$^2$ is formed in the SiN film 104 and the TEOS film 105, using photolithography and reactive ion etching (RIE).

Figure 2B:
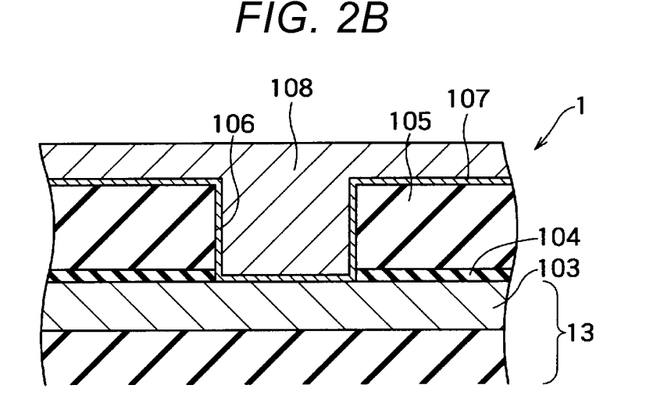

Next, a titanium nitride (TiN) film 107 is formed in the opening 106 through chemical vapor deposition (CVD). In addition, as shown in FIG. 2B, a seed Cu film is formed on the TiN film 107, and, successively, a Cu film 108 is formed on the seed Cu film through electrolytic plating. Further, another metal film may be formed instead of the Cu film 108.

Figure 2C:
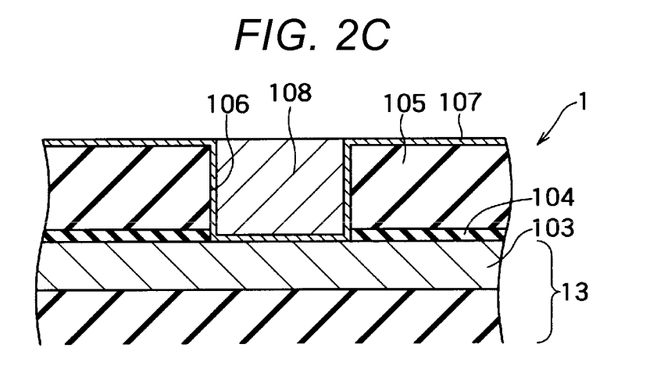

As shown in FIG. 2C, the Cu film 108 is polished through chemical mechanical polishing (CMP) by using the TiN film 107 as a stopper. At this time, a silica dispersion containing an oxidizing agent such as hydrogen peroxide or ammonium persulfate is used as slurry. A two-layer product such as, for example, IC1000/SUBA400 manufactured by Nitta Haas Incorporated can be used as a polishing pad.

Figure 2D:
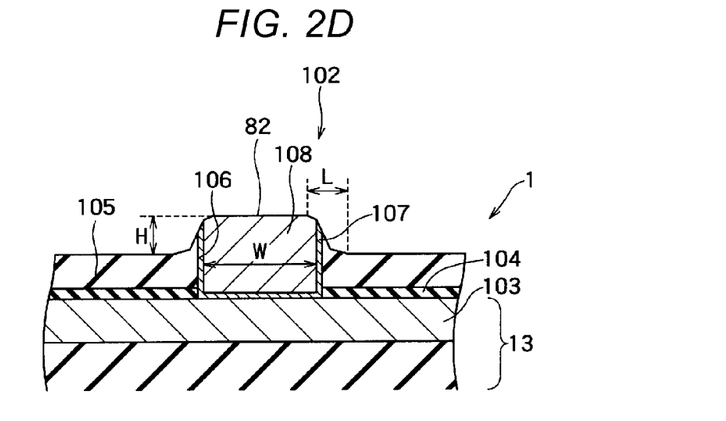

Subsequently, as shown in FIG. 2D, the Cu film 108, the TiN film 107, and the TEOS film 105 are polished using reverse selection CMP through polishing time control. The reverse selection CMP is a method in which the surroundings of a region to be flattened are mainly polished as compared with a typical CMP (normal selection CMP) in which the region to be flattened is mainly polished. Since the surroundings (the TiN film 107 and the TEOS film 105) of the connection electrode 102) are polished more than the connection electrode 102 (the Cu film 108) by using the reverse selection CMP, the bonding surface of the connection electrode 102 can be prevented from having a concave (dished) shape (a recessed shape). Therefore, the bonding surface of the connection electrode 102 is formed not in a dished shape but in a flat shape or a shape in which an outer circumferential part is lower than a central part (convex shape). For this reason, when the device substrates 1 and 2 are stacked, the contact area between the bonding surfaces of the connection electrodes 102 and 202 can be increased, and bonding strength between the connection electrodes 102 and 202 can also be increased.

The slurry used in the reverse selection CMP is a CMP slurry for $SiO_2$, and, preferably, does not contain such an oxidizing agent which oxidizes the surface of the Cu film 108. This slurry may include, for example, a silica dispersion containing potassium hydroxide, and a ceria (cerium oxide) dispersion containing a surfactant. By the use of this slurry, the Cu film 108 and the TiN film 107 are polished due to a mechanical effect, and the TEOS film 105 is polished due to a synergistic effect of a chemical effect added to the mechanical effect (a mechanochemical process). For this reason, a polishing rate of the TEOS film 105 is higher than a polishing rate of the Cu film 108 and the TiN film 107, and the TEOS film 105 is preferentially removed. Therefore, the upper surface of the Cu film 108 can be prevented from having a dished shape.

In addition, as a polishing pad used in the reverse selection CMP, a pad which has hardness of 30 MPa or less (for example, Politex II Supreme manufactured by Nitta Haas Incorporated) is preferably used. This polishing pad is used, as shown in the cross-sectional view of FIG. 2D, so as to increase a protrusion extent H of the connection electrode 102 from the front surface 31 of the device substrate 1 and reduce a transition distance L. Accordingly, the cross-section of the connection electrode 102 has a trapezoidal shape. A distance L corresponding to the trapezoidal spread is referred to as a transition distance L (a difference of a length between an upper base and lower base of the trapezoidal). The transition distance L depends on hardness of a polishing pad, and can be reduced by reducing the hardness of the pad. In general, when the transition distance L is reduced the contact area of the bonding surface 82 of the connection electrode 102 is increased, thereby increasing bonding strength between the connection electrodes 102 and 202. For example, if a width W of the connection electrode is 10 μm, and a protrusion extent H is 1 μm, a polishing pad is preferably selected so that the transition distance L is about 0.5 μm.

In addition, reverse selection CMP may be used in which the SiN film 104 is used as a stopper, instead of the above-described reverse selection CMP through polishing time control.

The connection electrode 202 is formed in a similar manner as the connection electrode 102. The connection electrode 102 and the connection electrode 202 formed in this way are diffusion-bonded to each other so as to form the stacked body 10.

Figure 3:
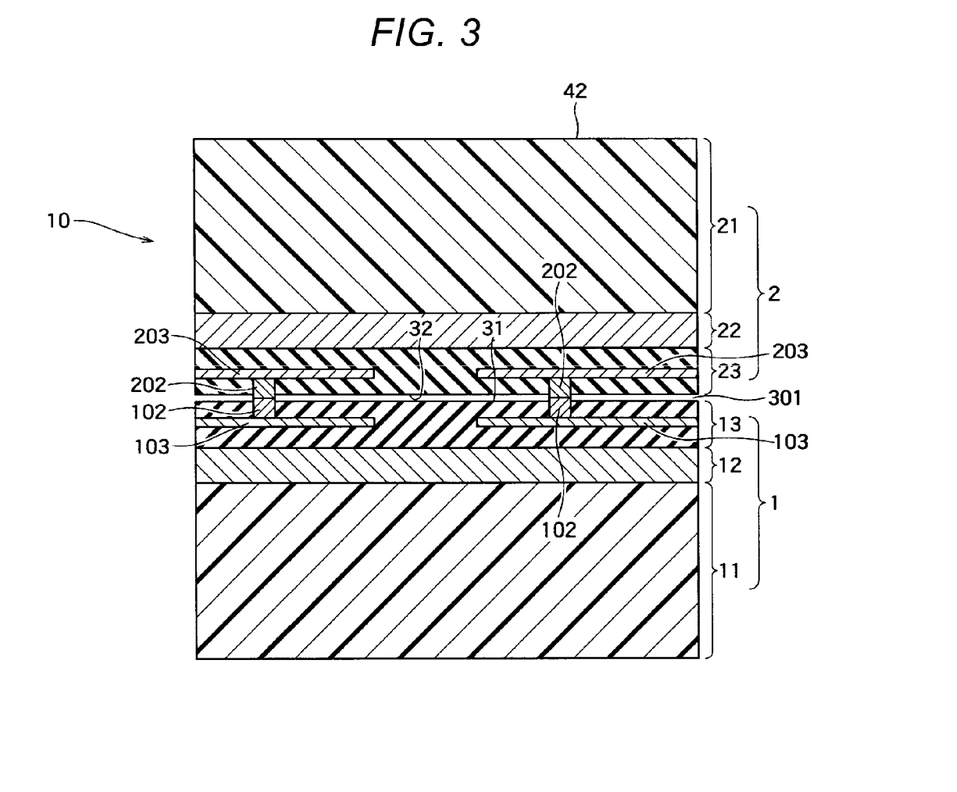
FIG. 3 is a cross-sectional view of the semiconductor device according to the first embodiment.

FIG. 3 is a cross-sectional view illustrating an example of a configuration of the stacked body 10. The stacked body 10 includes the stacked device substrate 1 and device substrate 2. The device substrates 1 and 2 respectively have the device layers 12 and 22 in which elements (not specifically depicted) such as transistors are formed, wire layers 13 and 23 in which wirings 103 and 203 are formed, and silicon layers 11 and 21. The connection electrodes 102 and 202 are formed on the front surfaces 31 and 32 of the device substrates 1 and 2. For example, the connection electrodes 102 and 202 protrude to an extent of 1 to 2 μm from the front surfaces 31 and 32. In addition, the connection electrodes 102 and 202 are bonded to each other through diffusion bonding.

Figure 4:
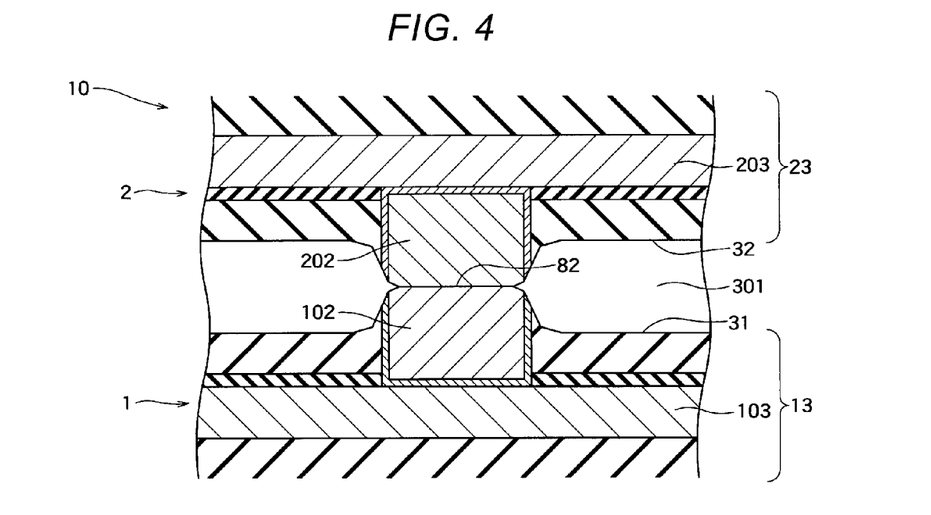
FIG. 4 is an enlarged cross-sectional view of portions of the semiconductor device according to the first embodiment.

FIG. 4 is an enlarged cross-sectional view of the vicinities of the connection electrodes 102 and 202 of the stacked body 10 of FIG. 3. The corners on the bonding surface 82 side of the cross-section of the connection electrodes 102 and 202 are round, and the cross-section of the connection electrodes 102 and 202 has a trapezoidal shape. The bonding surface 82 of the connection electrodes 102 and 202 has a shape in which the central part is formed not in a dished (concave) shape but in a flat shape, or may have a convex shape in which the outer circumferential part is more recessed than the central part. In addition, Ra (arithmetic average roughness within a range from several nm to several tens of nm) of the central part of the bonding surface 82 is about 0.1 nm to 1 nm.

According to the present embodiment, since the connection electrodes 102 and 202 of the device substrates 1 and 2 are bonded together without using melting bonding, the connection electrode material does extrude laterally, as happens in a melt bonding process, and thus the connection electrodes which are adjacent to each other can be prevented from being short-circuited. Accordingly, a pitch between the connection electrodes 102 and 202 in the surfaces of the device substrates 1 and 2 can be reduced.

In order to increase bonding strength between the connection electrodes 102 and 202, the contact area between the bonding surfaces can be increased by flattening the bonding surfaces of the connection electrodes 102 and 202. As a method of flattening the bonding surfaces, there is a method of using CMP. However, as a result of examination of the present inventors, if typical CMP (normal selection CMP) is used, the bonding surface had a dished shape, and the contact area between the bonding surfaces is found to be hard to increase in this manner.

In contrast, according to the present embodiment, if the reverse selection CMP is used, the bonding surfaces of the connection electrodes 102 and 202 are prevented from having a dished shape, thereby the bonding surfaces are flattened/polished. In this manner, bonding strength between the connection electrodes 102 and 202 can be increased by increasing the contact area between the bonding surfaces.

Specifically, when the reverse selection CMP is performed, a silica dispersion containing potassium hydroxide, or the like, is used as slurry, and thus a polishing rate of the TEOS film 105 around the connection electrodes 102 and 202 is greater than a polishing rate of the connection electrodes 102 and 202. Therefore, the TEOS film 105 around the connection electrodes 102 and 202 is preferentially removed and bonding surfaces of the connection electrodes 102 and 202 do not become a dished shape.

Further, when the reverse selection CMP is performed, a polishing pad with low hardness is used so as to increase a protrusion extent H of the connection electrodes 102 and 202 and to reduce a transition distance L. By this technique the area of the bonding surfaces of the connection electrodes 102 and 202 can also be increased, thereby increasing bonding strength between the connection electrodes 102 and 202.

In addition, in the stacked body 10 in which a high-frequency large current flows between the connection electrodes 102 and 202, parts provided in the stacked body 10 may be heated and, consequentially, thermally expanded by the large current. When the parts are thermally expanded, internal stress occurs in the stacked body 10 due to differences between thermal expansion coefficients of materials in the stacked body. This internal stress may cause characteristics of devices included in the stacked body 10 to vary. In order to prevent the variation in characteristics, in the stacked body 10 in which a high-frequency large current flows, a filling material (not specifically depicted) is preferably injected into the gap 301 (refer to FIG. 4) between the device substrates 1 and 2 after being stacked. The internal stress may be lessened by injecting the filling material into the gap 301.

Further, if the device substrates 1 and 2 include an organic material part which is relatively thermally unstable, the bonding surfaces of the connection electrodes 102 and 202 are preferably bombarded with Ar (argon) in vacuum immediately before diffusion bonding is performed. If the bombardment with Ar is performed, the bonding surfaces of the connection electrodes 102 and 202 become cleaner, and thus diffusion bonding process can be performed at a lower heating temperature. Since bonding heating temperature can be lowered, deterioration in the organic material part due to heat can be prevented.

Modification Example 1

When the stacked body 10 is formed, not only bonding between front surfaces of the device substrates 1 and 2 as described hitherto but also bonding between a front surface and a rear surface of the device substrates or bonding between rear surfaces of the device substrates may be performed. Therefore, connection electrodes may also be required to be formed in rear surfaces of the device substrates. Thus, a description will be made of a method of forming a connection electrode on the rear surface of the device substrate as a modification example.

A connection electrode of the rear surface can be formed using a TSV (through silicon via). Formation of the TSV is largely classified into formation from a front surface side of a device substrate and formation from a rear surface side. First, a description will be made of a case of forming a connection electrode 502 by using a TSV 500 which is formed from a rear surface 45 side of a device substrate 5, with reference to FIGS. 5A to 5D and FIGS. 6A and 6B. FIGS. 5A to 5D and FIGS. 6A and 6B are enlarged cross-sectional views of a region in which the connection electrode 502 of the device substrate 5 is scheduled to be formed. The device substrate 5 has the same form as the device substrate 1 except that the TSV 500 is provided.

Figure 5A:
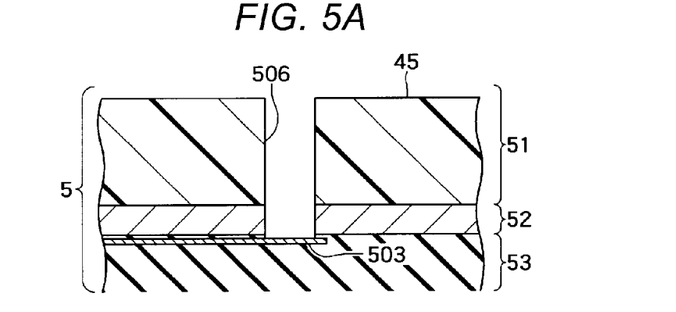
FIGS. 5A to 5D are cross-sectional views illustrating a manufacturing method of a semiconductor device according to a modification example.

As shown in FIG. 5A, an opening 506 is formed which penetrates through a silicon layer 51 and a device layer 52 from the rear surface 45 of the device substrate 5 and reaches a wiring 503 of a wire layer 53.

Figure 5B:
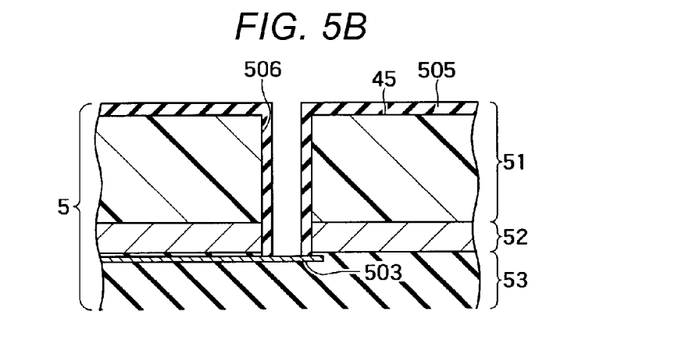

A TEOS film 505 is formed so as to cover the rear surface 45 and a bottom part and a side wall part of the opening 506. In addition, as shown in FIG. 5B, the TEOS film 505 located at the bottom part of the opening 506 is removed through RIE.

Figure 5C:
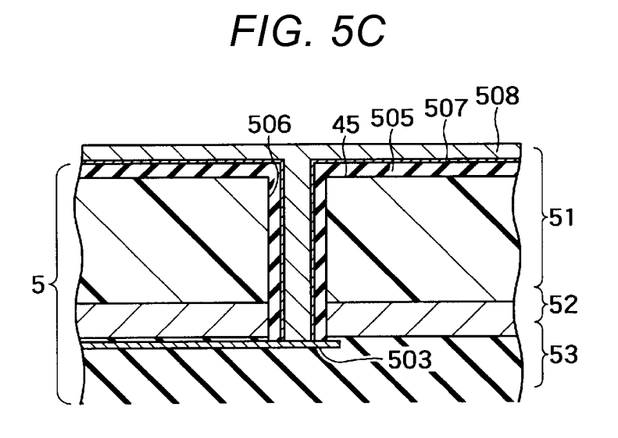

Next, as shown in FIG. 5C, a TiN film 507 and a Cu film 508 are formed in the opening 506.

Figure 5D:
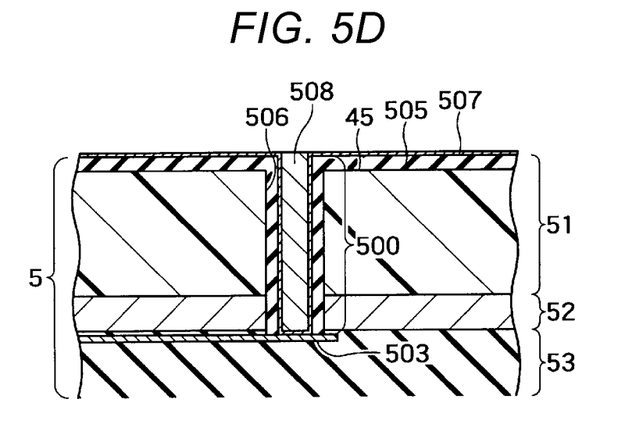

The Cu film 508 is polished using the TiN film 507 as a stopper through CMP (normal selection CMP), so as to form the TSV 500 shown in FIG. 5D.

Figure 6A:
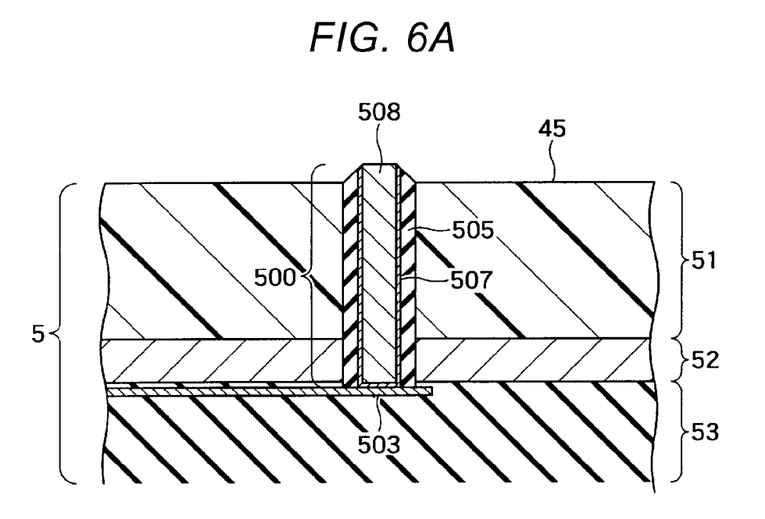
FIGS. 6A and 6B are cross-sectional views illustrating the manufacturing method of the semiconductor device according to the modification example.

Next, as shown in FIG. 6A, the Cu film 508, the TiN film 507, and the TEOS film 505 are polished using the silicon layer 51 as a stopper through reverse selection CMP. As slurry used in the reverse selection CMP, a slurry is preferably used which is CMP slurry for SiO$_2$, does not contain an oxidizing agent that oxidizes the surface of the Cu film 508, and suppresses a polishing rate of the silicon layer 51. For example, this slurry may include a ceria dispersion containing a surfactant. If CMP is performed using this slurry, the TiN film 507 and the TEOS film 505 are preferentially removed as compared with the Cu film 508. Therefore, in the same manner as in the embodiment described hitherto, the polished surface (the upper surface of the TSV 500) of the Cu film 508 can be prevented from having a dished shape.

Figure 6B:
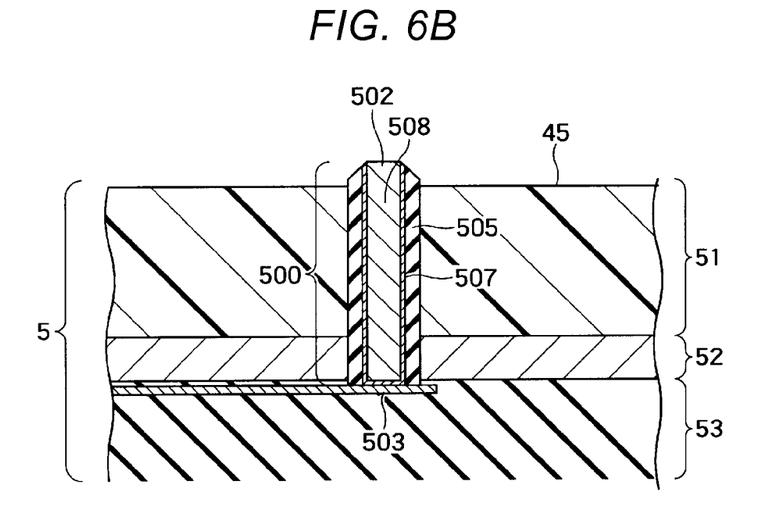

Next, the silicon layer 51 is wet-etched using a potassium hydroxide (KOH) solution in order to remove Cu contamination on the silicon layer 51. In this way, as shown in FIG. 6B, the connection electrode 502 having a shape protruding from the rear surface 45 of the device substrate 5 is formed in the front end region of the TSV 500. Specifically, the cross-section of the connection electrode 502 has a trapezoidal shape as a whole. The bonding surface 82 of the connection electrode 502 has a shape in which the central part is formed not in a dished shape which is recessed like a dish but in a flat shape, or has a shape in which the outer circumferential part is lower than the central part.

In addition, a reverse selection CMP through polishing time control may be used instead of the reverse selection CMP of using the silicon layer 51 as a stopper. As slurry in this case, a silica dispersion containing potassium hydroxide may also be used in addition to the above-described slurry.

Modification Example 2

Next, as a modification example 2, a description will be made of a case of forming a connection electrode 602 by using a TSV 600 which is formed from a front surface side of a device substrate 6, with reference to FIG. 7 and FIGS. 8A to 8D. The device substrate 6 has the same form as the device substrate 1 except that the TSV 600 is provided.

Figure 7:
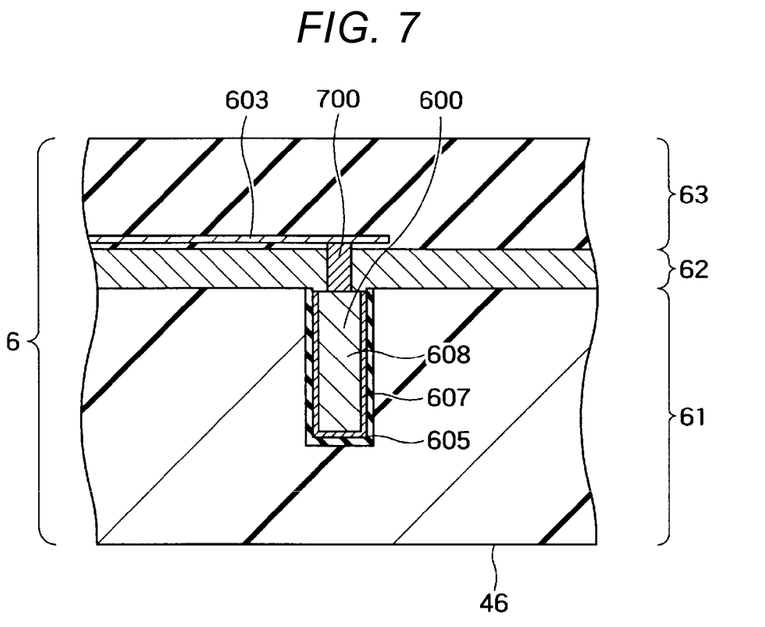
FIG. 7 is a cross-sectional view illustrating the manufacturing method of the semiconductor device according to the modification example.
Figure 8A:
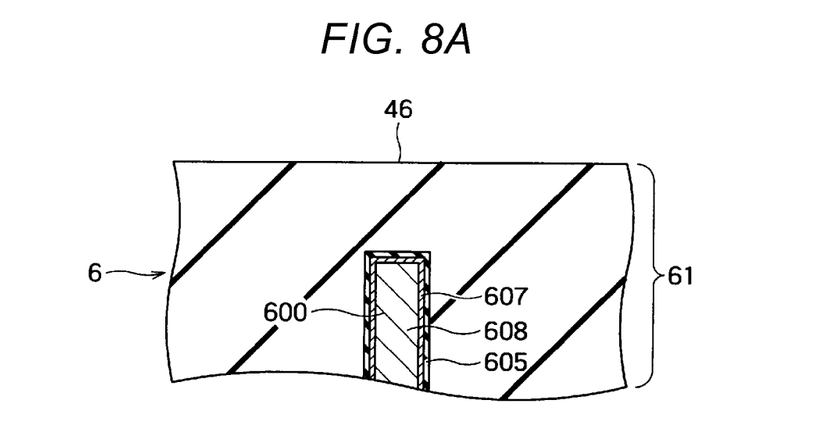
FIGS. 8A to 8D are cross-sectional views illustrating the manufacturing method of the semiconductor device according to the modification example.

As shown in FIG. 7, the TSV 600 that penetrates from a surface on a device layer 62 side of a silicon layer 61 to the middle of the film thickness of the silicon layer 61 is formed in the device substrate 6. The TSV 600 has a Cu film 608 which is embedded in the silicon layer 61 via a TiN film 607 and a TEOS film 605—that is TiN film 607 and TEOS film 605 are between Cu film 608 and the silicon layer 61. In addition, the TSV 600 is connected to a wiring 603 of a wire layer 63 via a plug 700 which penetrates through the device layer 62. FIG. 8A is an enlarged view of the front end part of the TSV 600. In addition, in FIG. 8A, the front end part of the TSV 600 on a rear surface 46 of the device substrate 6 is located on the upper part of the figure. Further, also in FIGS. 8B to 8D, in the same manner as in FIG. 8A, the front end part of the TSV 600 is located on the upper part of the figures.

Figure 8B:
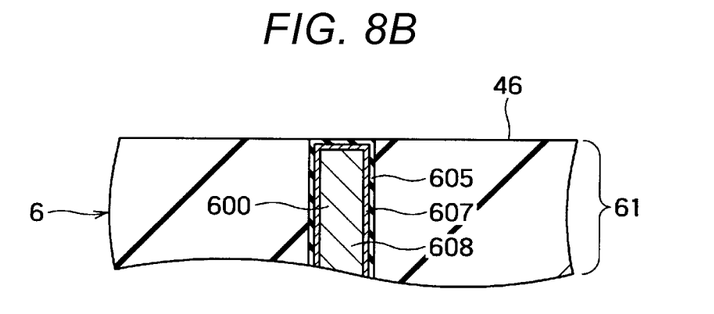

As shown in FIG. 8B, the rear surface 46 is polished with a whetstone until the TEOS film 605 is exposed.

Figure 8C:
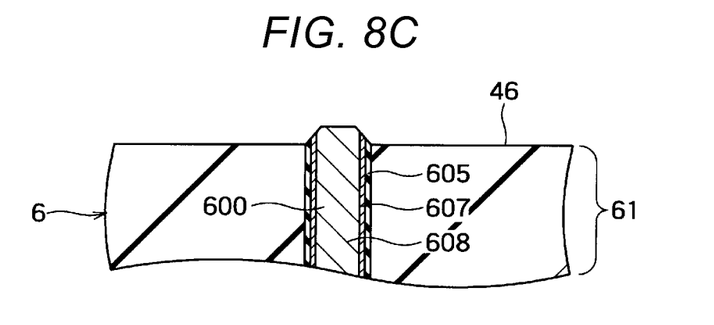

After TEOS film 605 is exposed, reverse selection CMP through polishing time control is performed. In this case, slurry is used which allows the silicon layer 61 and the TEOS film 605 to be polished at the substantially same rate, and the Cu film 608 to be polished at a rate lower than the rate of the silicon layer 61 and the TEOS film 605. In addition, since the TiN film 607 has a small film thickness, slurry used in this case may have a polishing rate greater than zero for the TiN film 607. This slurry may use a silica and ceria mixed dispersion containing potassium hydroxide. The CMP is performed using this slurry, and thus the silicon layer 61 and the TEOS film 605 are preferentially removed as compared with the Cu film 608. Therefore, as shown in FIG. 8C, the polished surface (the upper surface of the TSV 600) of the Cu film 608 having no dished shape can be obtained.

Figure 8D:
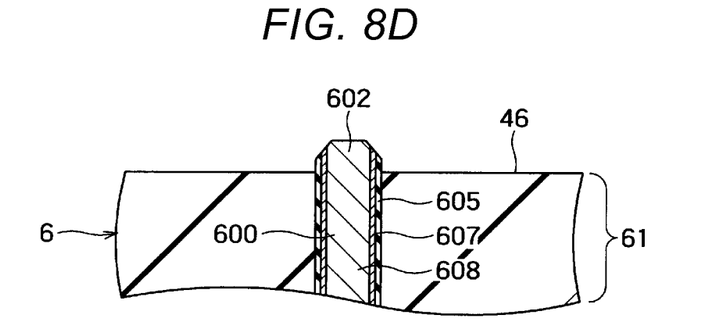

In addition, the silicon layer 61 is etched in order to remove Cu contamination on the silicon layer 61. In this way, as shown in FIG. 8D, the connection electrode 602 having a shape protruding from the rear surface 46 of the device substrate is formed in the front end region of the TSV 600. Specifically, the cross-section of the connection electrode 602 has a trapezoidal shape. The bonding surface 82 of the connection electrode 602 is flat, or is formed so that the outer circumferential part thereof is lower than the central part thereof.

As above, in modification examples 1 and 2, in the same manner as in the first embodiment, the connection electrodes 502 and 602 which protrude from the rear surfaces of the device substrates 5 and 6 are formed using the reverse selection CMP. For this reason, the bonding surfaces of the connection electrodes 502 and 602 can be prevented from having a dished shape so as to form flat bonding surfaces. Accordingly, the contact area between the bonding surfaces of the connection electrodes 502 and 602 can be increased, thereby increasing bonding strength between the connection electrodes 502 and 602.

Second Embodiment

In the second embodiment, a connection electrode having a protruding shape and a connection electrode having a concave shape are diffusion-bonded to each other so as to obtain the stacked body 10.

Formation of Connection Electrodes

Figure 9A:
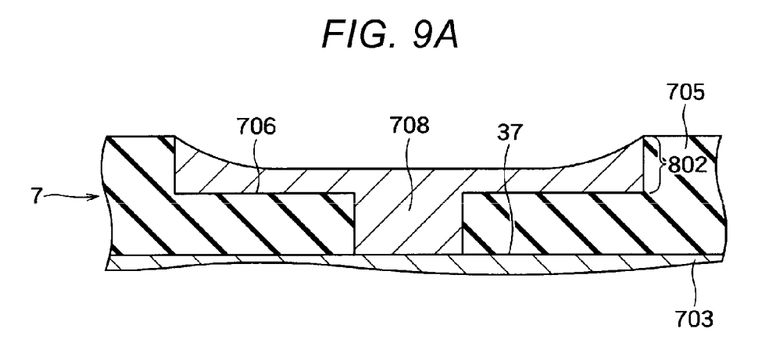
FIGS. 9A and 9B are cross-sectional views illustrating a manufacturing method of a semiconductor device according to a second embodiment.
Figure 9B:
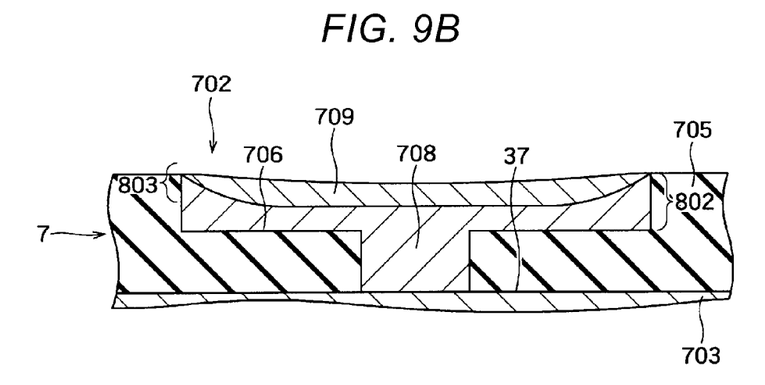

FIGS. 9A and 9B are enlarged cross-sectional views of a region in which a connection electrode 702 of a device substrate 7. First, with reference to FIGS. 9A and 9B, a description will be made of a method of forming the connection electrode 702 with a concave shape on a front surface 37 of the device substrate 7. In addition, the device substrate 7 is similar to device substrate 1 except for the connection electrode 702.

A silicon oxide film 705 is formed on a wiring 703 positioned on the front surface 37 of the device substrate 7. Next, an opening 706 is formed in the silicon oxide film 705 according to procedures for forming a groove and a hole in a dual damascene method (that is, the opening 706 as two or more levels, one level which is within layer 705 and another level which is at the upper surface of wiring 703), and a Cu film 708 is embedded in the opening 706. Successively, CMP (normal selection CMP) is performed on the Cu film 708 so as to form a lower layer part 802 of the connection electrode 702. For example, a POLITEX (manufactured by Dow Electronic Materials Corporation) polishing pad with low hardness can be used as a polishing pad in this polishing step. This polishing pad is used such that the upper surface of the Cu film 708 is in a dished shape after polishing, as shown in FIG. 9A.

An Ag (silver) film 709 is formed on the Cu film 708 using a sputtering deposition method. Next, CMP (normal selection CMP) is performed on the Ag film 709 by using a polishing pad (for example, IC1000 (manufactured by Nitta Haas Incorporated)) with high hardness so as to leave the Ag film 709 in the region where the upper surface of the Cu film 708 is concave (dished). In this way, as shown in FIG. 9B, the connection electrode 702 is formed to have an upper layer part 803 comprising the Ag film 709. Subsequently, the connection electrode 702 is diffusion-bonded to the connection electrode 502 having a protruding shape of the device substrate 5. The connection electrode 702 is preferably formed so that the bonding surface (the upper surface) of the upper layer part 803 of the connection electrode 702 is wider than the bonding surface of the connection electrode 502. Since the bonding surface of the upper layer part 803 of the connection electrode 702 is wider than the bonding surface of the connection electrode 502, the upper layer part 803 of the connection electrode 702 can receive the front end of the connection electrode 502 having a protruding shape when diffusion bonding is performed.

In the present embodiment, the second metal forming the upper layer part 803 is not limited to Ag, and is preferably selected from metals with malleability or ductility larger than that of the metal forming the connection electrode 502. This metal for upper layer 803 is selected with appropriate malleability and ductility, and thus the connection electrode 502 having a protruding shape may penetrate into the connection electrode 702 like a wedge when diffusion bonding is performed, thereby further increasing bonding strength between the connection electrodes 502 and 702.

In addition, a metal on which diffusion bonding can be performed at a low temperature along with the first metal (the metal of connection electrode 502) is preferably selected as the second metal (the metal 709). If diffusion bonding can be performed at a low temperature, the occurrence of distortion due to thermal stress inside the device substrates 5 and 7 can be prevented, and thus variations in electrical characteristics of device elements and the like due to the distortion can be avoided.

Further, a metal (10 μΩcm or less at room temperature), which decreases in electrical resistivity when diffusion bonding is performed between the metal and the first metal forming the connection electrode 502, is preferably selected as the second metal. This metal is selected, and thus resistance between the connection electrode 502 and the connection electrode 702 is low, thereby making electrical characteristics between the connection electrodes 502 and 702 favorable.

Examples of the second metal may include tin (Sn), indium (In), and the like, in addition to Ag. For example, if Ag is used as the second metal, and Cu is used as the first metal, a heating temperature in diffusion bonding may be about 150° C.

Formation of Stacked Body

The connection electrode 702 formed in this way is diffusion-bonded to the connection electrode 502 having a protruding shape, such as depicted for the device substrate 5, so as to form the stacked body 10.

Figure 10:
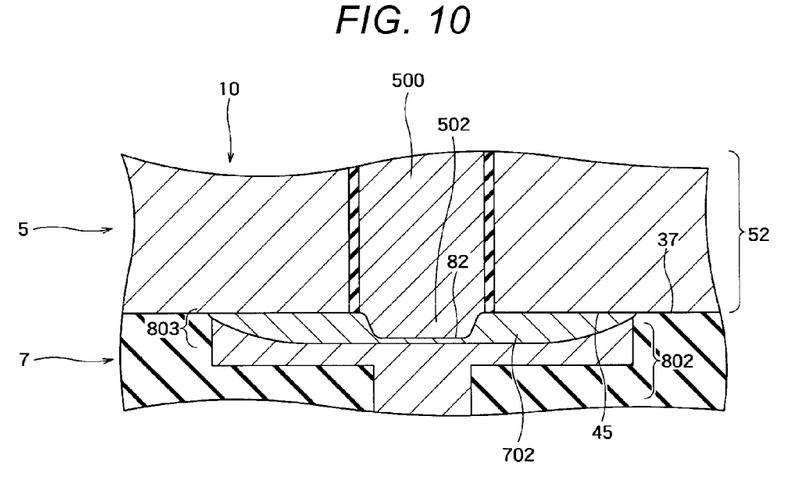
FIG. 10 is an enlarged cross-sectional view of portions of the semiconductor device according to the second embodiment.

FIG. 10 is an enlarged view of the bonding portion of the stacked body 10. In the stacked body 10 of FIG. 10, the device substrate 5 and the device substrate 7 are stacked. The device substrate 5 has the connection electrode 502 at a front end of the TSV 500 that penetrates through the silicon layer 52. The connection electrode 502 protrudes from the rear surface 45 of the device substrate 5, and a cross-section of the protrusion has a trapezoidal shape. The bonding surface 82 of the connection electrode 502 is flat or is formed so that the outer circumferential part thereof is lower than the central part thereof.

In addition, the device substrate 7 has the connection electrode 702 which is concave from the front surface 37 of the device substrate 7. The connection electrode 702 includes the lower layer part 802 and the upper layer part 803 laminated thereon, and the upper surface of the upper layer part 803 has a concave shape. The connection electrode 502 of the device substrate 5 penetrates into the upper layer part 803 of the connection electrode 702 like a wedge and is diffusion-bonded to the connection electrode 702. The second metal forming the upper layer part 803 of the connection electrode 702 preferably has malleability or ductility larger than that of the first metal forming the connection electrode 502. Further, a metal on which diffusion bonding can be performed at a low temperature along with the first metal is preferably selected as the second metal. Furthermore, a metal, which decreases in electrical resistivity when diffusion bonding is performed, is preferably selected as the second metal.

The connection electrode 702, in this embodiment, has a concave shape and is made of the malleable second metal, and thus the connection electrode 502 having a protruding shape can penetrates into the connection electrode 702 like a wedge. As connection electrode 502 acts like a wedge, bonding strength between the connection electrodes 502 and 702 can be increased.

While certain embodiments have been described, these embodiments have been presented by way of example only, and are not intended to limit the scope of the disclosure. Indeed, the embodiments described herein may be embodied in a variety of other forms; furthermore, various omissions, substitutions and changes in the form of the examples described herein may be made without departing from the spirit of the disclosure. The accompanying claims and their equivalents are intended to cover such forms or modifications as would fall within the scope and spirit of the disclosure.

What is claimed is:

1. A method of manufacturing a semiconductor device, comprising:
    forming an opening in a first substrate;
    forming a stopper layer on a surface of the first substrate in a region surrounding the opening;
    forming a first metal in the opening and on the stopper layer;
    polishing the first metal with a first chemical mechanical polishing and stopping on the stopping layer to form a first connection electrode in the first substrate;

polishing the first substrate using a second chemical mechanical polishing in which a polishing rate of the first metal is less than that of a region surrounding the first connection electrode thereby causing the first connection electrode to protrude from the first substrate;

stacking the first substrate and a second substrate that includes a second connection electrode such that the first and second connection electrodes face each other; and diffusion-bonding the first and second connection electrodes to each other by pressing and heating the first and second substrates to a temperature at or below the melting point of the first metal.

2. The method of claim 1, wherein the opening in the first substrate is a through-substrate-via.

3. The method of claim 1, wherein the temperature is below the melting point of the first metal.

4. The method of claim 1, wherein the diffusion-bonding is performed at 100° C. or more and 500° C. or less.

5. The method of claim 1, wherein the second connection electrode has a bonding surface that has a concave shape.

6. The method of claim 1, further comprising:
forming an opening in the second substrate;
filling the opening in the second substrate with a second metal to form the second connection electrode; and
polishing the second substrate using chemical mechanical polishing, the second metal having a polishing rate that is less than a polishing rate of a region surrounding the second metal, the chemical mechanical polishing thereby causing the second connection electrode to protrude from the second substrate;
wherein the temperature used for bonding the first and second substrates is at or below a melting point of the second metal.

7. The method of claim 6, wherein the first and second metal are the same metal.

8. The method of claim 1, further comprising:
forming an opening in the second substrate;
filling the opening in the second substrate with a second metal;
polishing the second substrate using chemical mechanical polishing that causes an upper surface of the second metal to form a concave shape;
depositing a third metal on the upper surface of the second metal to fill the concave shape and form the second connection electrode;
polishing the second substrate using chemical mechanical polishing that causes an upper surface of the third metal to be a planar; and
bonding the first and second connection electrode by pressing and heating the first and second substrates to a temperature at or below the melting point of the first metal, a melting point of the second metal, and a melting point of the third metal.

9. The method of claim 1, further comprising:
bombarding an upper surface of the first connection electrode with argon after polishing the first substrate using the second chemical mechanical polishing.

10. The method of claim 1, wherein the second chemical mechanical polishing is performed using a polishing pad with hardness of 30 MPa or less.

11. A method of bonding substrates, comprising:
forming a first connection electrode in a first substrate by forming an opening in the first substrate, forming a stopper layer on the first substrate in a region surrounding the opening, forming a first metal in the opening and on the stopper layer, polishing the first metal using a first chemical mechanical polishing and stopping on the stopper layer;

polishing the first substrate using a second chemical mechanical polishing in which a polishing rate of the first metal is less than a polishing rate of a region surrounding the first connection electrode, the second chemical mechanical polishing thereby causing the first connection electrode to protrude from of the first substrate;

forming a second connection electrode in a second substrate, the second connection electrode comprising a second metal;

stacking the first and second substrates so that the first and second connection electrodes are opposed;

pressing the first and second substrates so that the first and second connection electrodes are in contact; and heating the first and second substrates to a temperature at or below a melting point of the first metal and at or below a melting point of the second metal.

12. The method of claim 11, wherein the pressing and heating steps occur at a same time.

13. The method of claim 11, wherein the first connection electrode protrudes from a front-side surface of the first substrate and the second connection electrode is formed on a back-side surface of the second substrate.

14. The method of claim 11, wherein the first and second metals are the same metal.

15. The method of claim 11, wherein the first and second metals are diffusion bonded by pressing and heating the first and second substrates.

16. The method of claim 11, wherein the first metal comprises copper.

17. The method of claim 11, wherein the second chemical mechanical polishing is performed using a slurry comprising a silica dispersion including potassium hydroxide and a polishing pad with a hardness of 30 MPa or less.

18. The method of claim 11, wherein the second connection electrode has a concave-shaped bonding surface.

19. The method of claim 1, wherein the first substrate includes an insulating film.

20. The method of claim 11, wherein the first substrate includes an insulating film.

21. A method of manufacturing a semiconductor device, comprising:
forming an opening in a first substrate;
filling the opening in the first substrate with a first metal to form a first connection electrode;
polishing the first substrate using chemical mechanical polishing, a polishing rate of the first metal is less than that of a region surrounding the first metal, the chemical mechanical polishing thereby causing the first connection electrode to protrude from a surface of the first substrate;
stacking the first substrate and a second substrate that includes a second connection electrode such that the first and second connection electrodes face each other; and
diffusion-bonding the first and second connection electrodes to each other by pressing and heating the first and second substrates to a temperature at or below the melting point of the first metal,
wherein the chemical mechanical polishing is performed using a polishing pad with hardness of 30 MPa or less.

\* \* \* \* \*